US008685823B2

(12) United States Patent
Bangsaruntip et al.

(10) Patent No.: US 8,685,823 B2
(45) Date of Patent: Apr. 1, 2014

(54) NANOWIRE FIELD EFFECT TRANSISTOR DEVICE

(75) Inventors: Sarunya Bangsaruntip, Mount Kisco, NY (US); Guy M. Cohen, Mohegan Lake, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 13/292,336

(22) Filed: Nov. 9, 2011

(65) Prior Publication Data
US 2013/0112937 A1    May 9, 2013

(51) Int. Cl.
H01L 21/336    (2006.01)

(52) U.S. Cl.
USPC ............ 438/283; 257/E21.415; 257/E21.444; 977/938

(58) Field of Classification Search
USPC .............. 977/938, 762; 257/9, E21.444, 257/E29.242; 438/183, 197, 283
See application file for complete search history.

(56) References Cited

U.S. PATENT DOCUMENTS

| 6,365,465 | B1* | 4/2002 | Chan et al. ................ 438/283 |
| 7,534,675 | B2 | 5/2009 | Bangsaruntip et al. |
| 7,855,135 | B2 | 12/2010 | Chang et al. |
| 7,884,004 | B2 | 2/2011 | Bangsaruntip et al. |
| 2005/0127412 | A1* | 6/2005 | Cohen et al. ................ 257/288 |
| 2005/0266645 | A1* | 12/2005 | Park ............................. 438/282 |
| 2006/0249784 | A1 | 11/2006 | Black et al. |
| 2007/0194387 | A1 | 8/2007 | Dyer et al. |
| 2007/0228439 | A1 | 10/2007 | Duan et al. |
| 2009/0057762 | A1 | 3/2009 | Bangsaruntip et al. |
| 2009/0174012 | A1 | 7/2009 | Iwasaki |
| 2009/0311835 | A1 | 12/2009 | Chu et al. |
| 2010/0019355 | A1 | 1/2010 | Kamins et al. |
| 2010/0065887 | A1 | 3/2010 | Goebel et al. |
| 2010/0090197 | A1 | 4/2010 | Park et al. |
| 2010/0193770 | A1 | 8/2010 | Bangsaruntip et al. |
| 2010/0295020 | A1 | 11/2010 | Barwicz et al. |
| 2011/0133162 | A1 | 6/2011 | Bangsaruntip et al. |
| 2011/0133165 | A1 | 6/2011 | Bangsaruntip et al. |
| 2011/0133169 | A1 | 6/2011 | Bangsaruntip et al. |
| 2011/0233522 | A1 | 9/2011 | Cohen et al. |
| 2011/0253981 | A1 | 10/2011 | Rooyackers et al. |

OTHER PUBLICATIONS

D. H. Kim et al., "Fabrication of Single-Electron Tunneling Transistors with an Electrically Formed Coulomb Island in a Silicon-on-Insulator Nanowire," J. Vac. Sci. Technol. B 20(4), Jul./Aug. 2002, pp. 1410-1418.

(Continued)

*Primary Examiner* — Daniel Luke
*Assistant Examiner* — Khaja Ahmad
(74) *Attorney, Agent, or Firm* — Cantor Colburn LLP; Louis Percello

(57) ABSTRACT

A method for forming a field effect transistor device includes forming a nanowire suspended above a substrate, forming a dummy gate stack on a portion of the substrate and around a portion of the nanowire, removing exposed portions of the nanowire, epitaxially growing nanowire extension portions from exposed portions of the nanowire, depositing a layer of semiconductor material over exposed portions of the substrate, the dummy gate stack and the nanowire extension portions, and removing portions of the semiconductor material to form sidewall contact regions arranged adjacent to the dummy gate stack and contacting the nanowire extension portions.

6 Claims, 16 Drawing Sheets

(56) References Cited

OTHER PUBLICATIONS

D. S. Lee et al., "Dual-Gate Single-Electron Transistor with Silicon Nano Wire Channel and Surrounding Side Gates," Japanese Journal of Applied Physics, vol. 49, 2010, 04DJ01, 5 pages.

S. Bangsaruntip et al., pending U.S. Appl. No. 12/830,514, filed with the U.S. Patent and Trademark office Jul. 6, 2010.

Shu-Fen Hu et al., "A Dual-Gate-Controlled Single-Electron Transistor Using Self-Aligned Polysilicon Sidewall Spacer Gates on Silicon-on-Insulator Nanowire," IEEE Transactions on Nanotechnology, vol. 3, No. 1, Mar. 2004, pp. 93-97.

T. Yoshitomi et al., "Silicided Silicon-Sidewall Source and Drain (S4D) Structure for High-Performance 75-nm Gate Length pMOSFETs," 1995 Symposium on VLSI Technology Digest of Technical Papers, pp. 11-12.

International Search Report and Written Opion for International Application No. PCT/US12/60346; International filing Date: Oct. 16, 2012 Date of mailing: Dec. 20, 2012; 22 pages.

Kim et al., "Fabrication of Single-Electron Tunneling Transistors with an Electrically Formed Coulomb Island in a Silicon-on-Insulator Nanowire," J. Vac. Sci. Technol. B; vol. 20, No. 4, Jul./Aug. 2002; pp. 1410-1418.

K.W. Guarini, et al.,"Triple-Self-Aligned, Planar Double-Gate MOSFETs: Devices and Circuits," IEEE, IEDM 01-425, 2001, pp. 1-4.

* cited by examiner

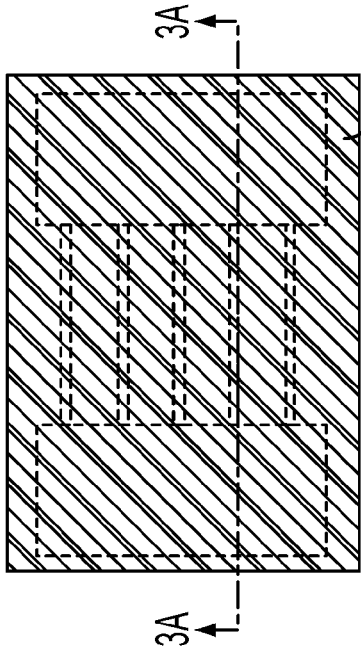
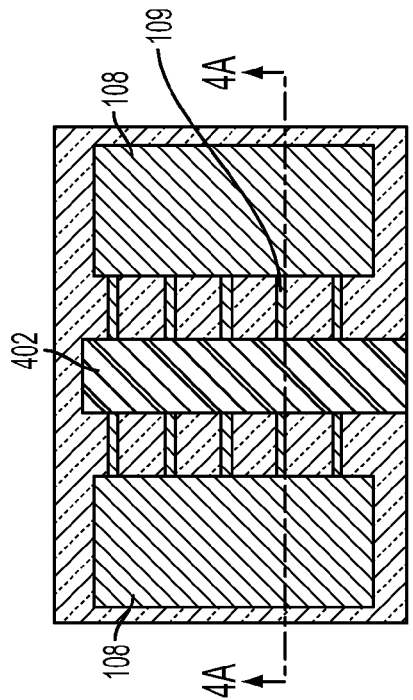
FIG. 3A
FIG. 3B
FIG. 4A
FIG. 4B

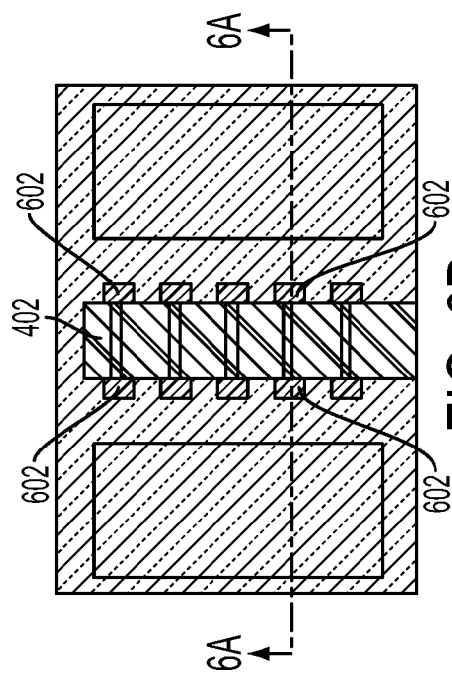
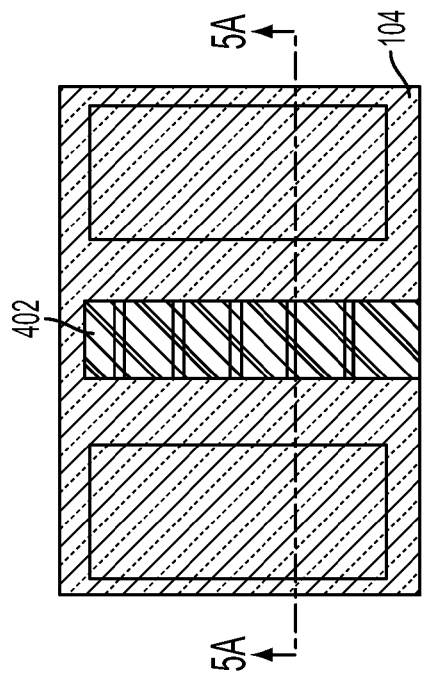
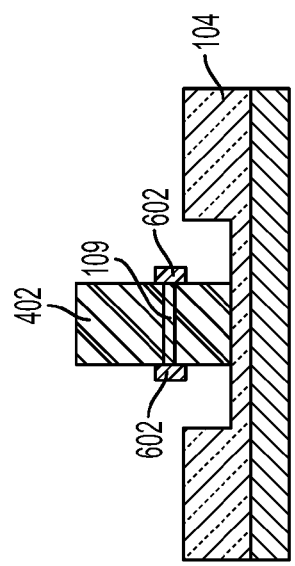
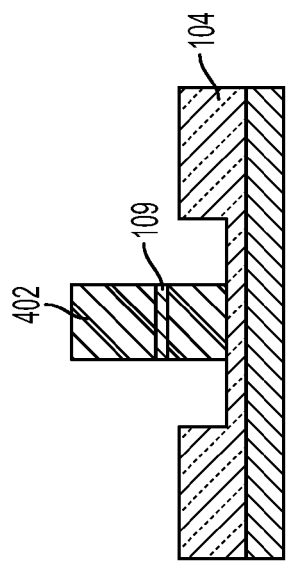

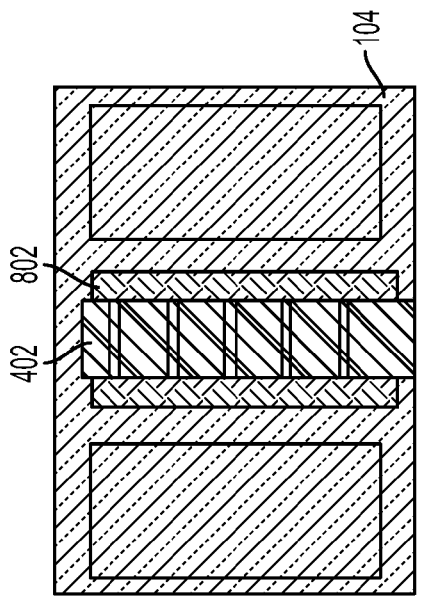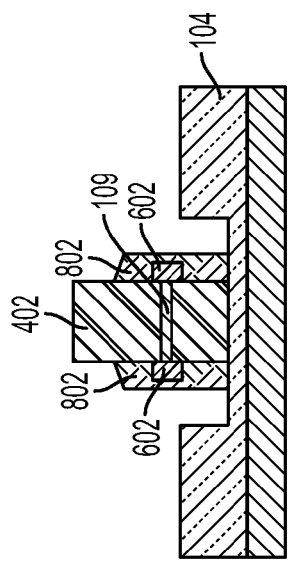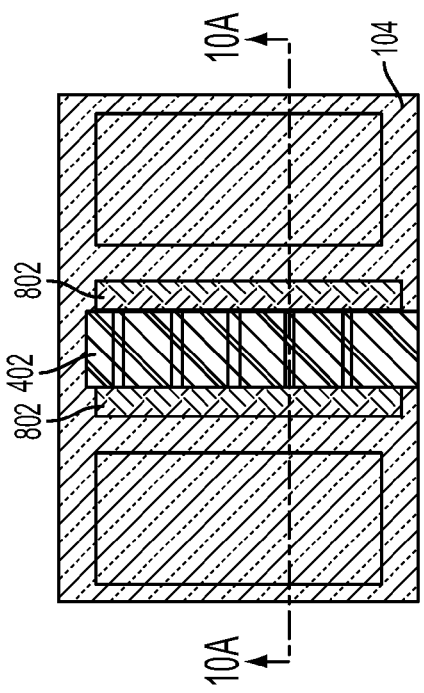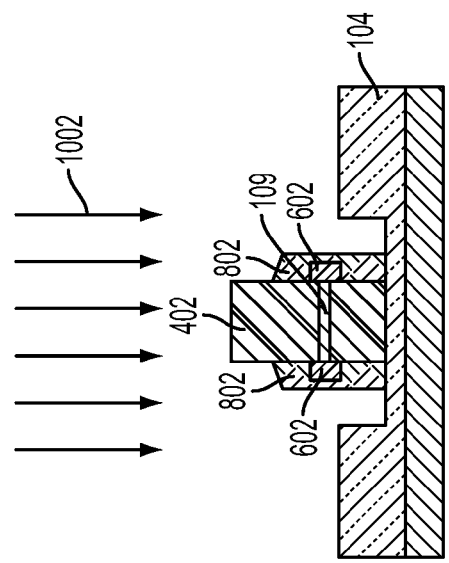

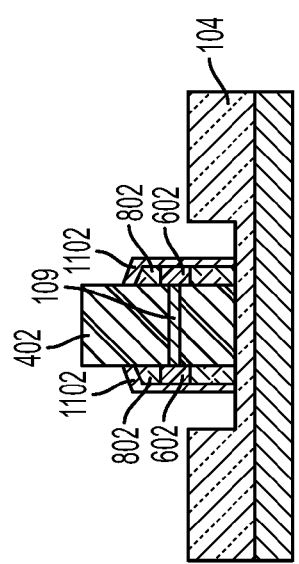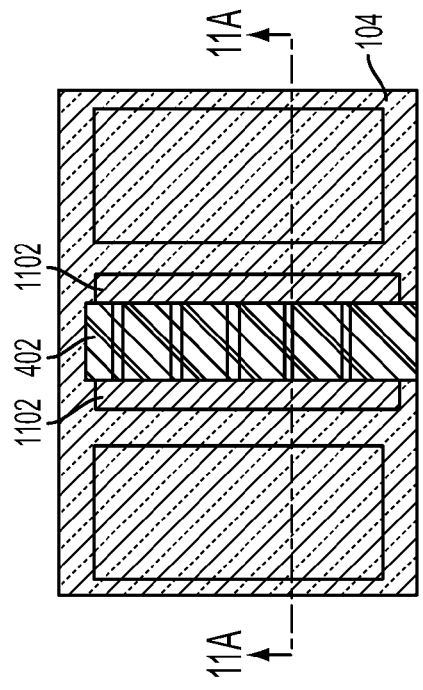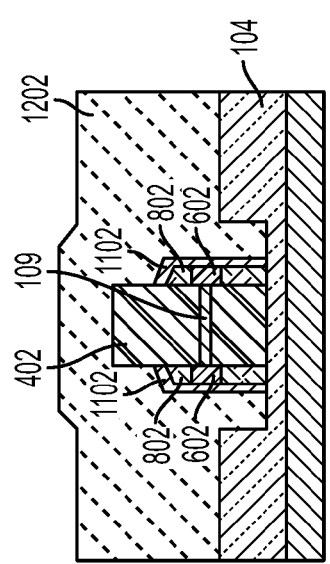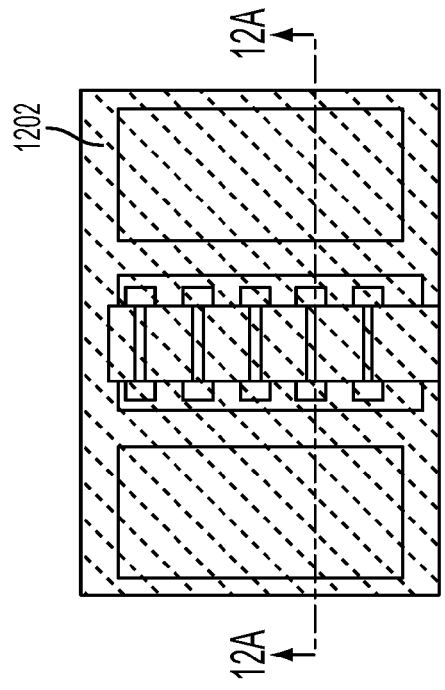

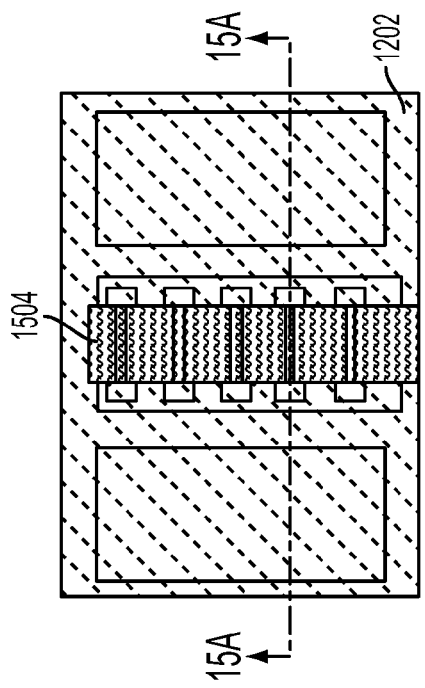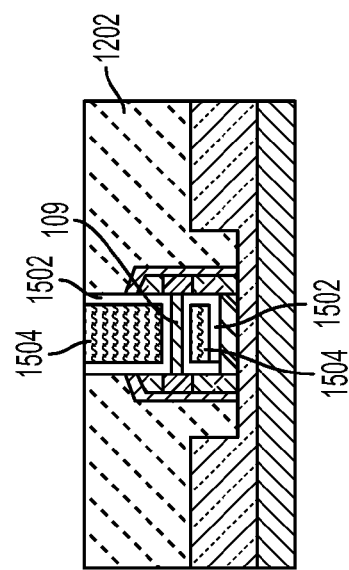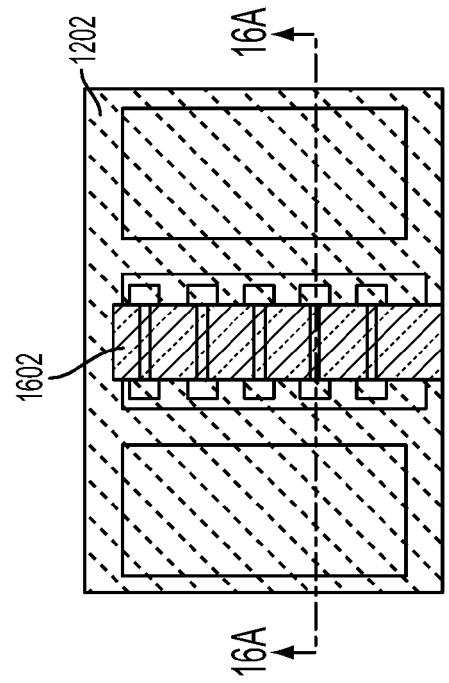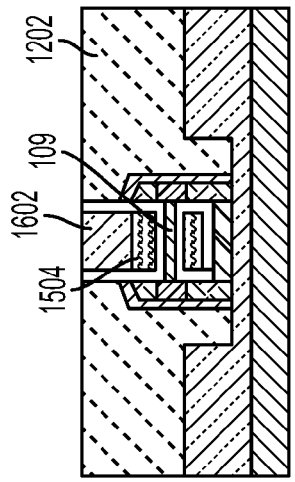

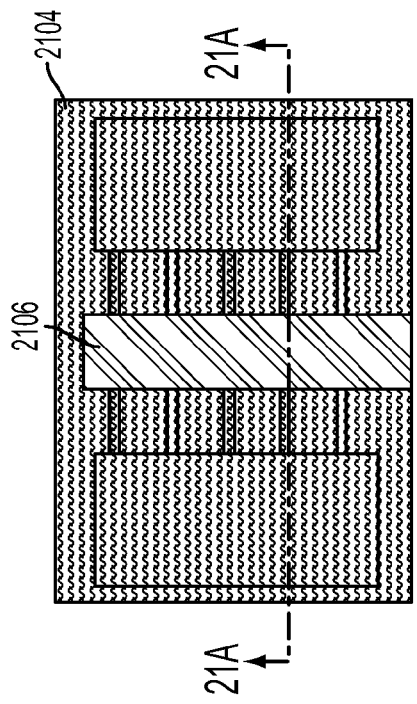
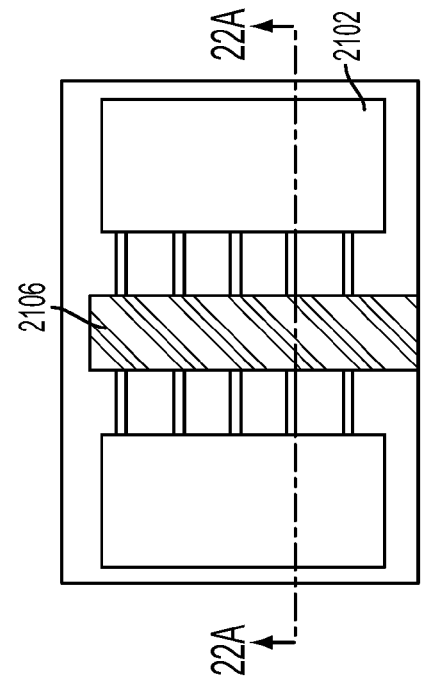
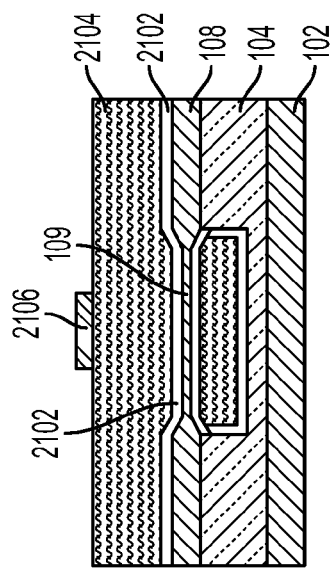
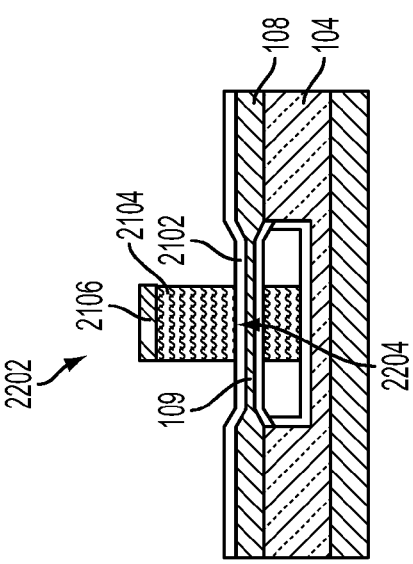

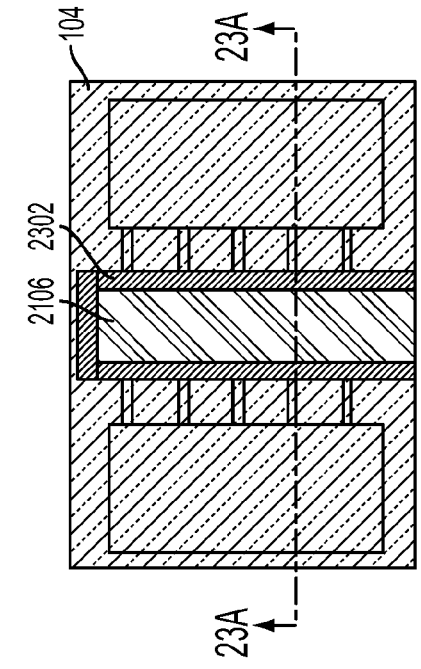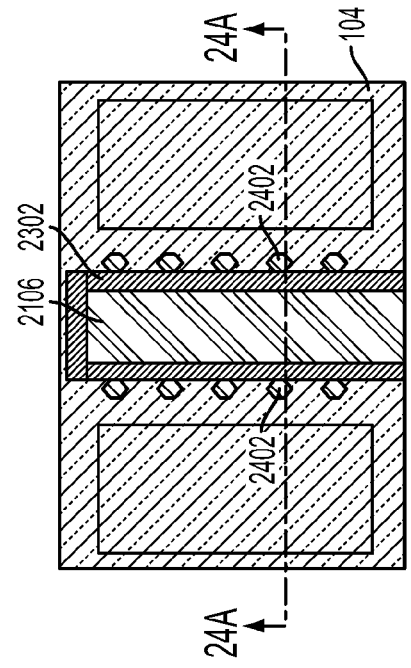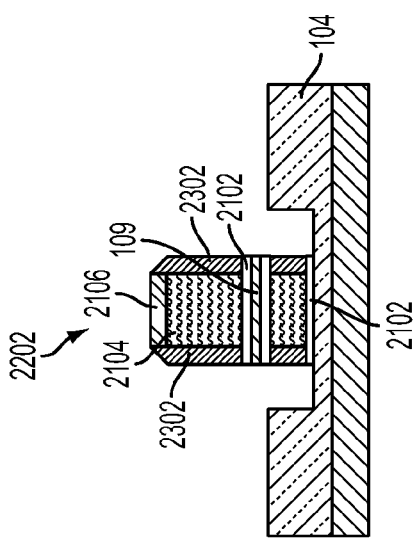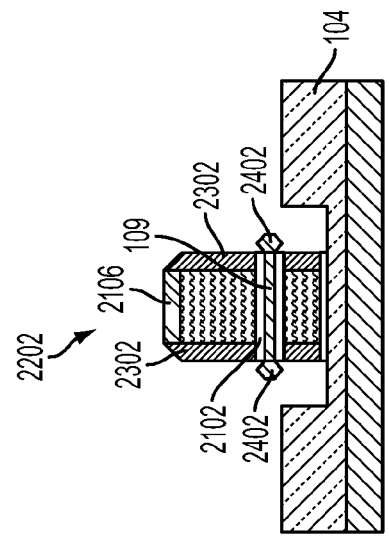

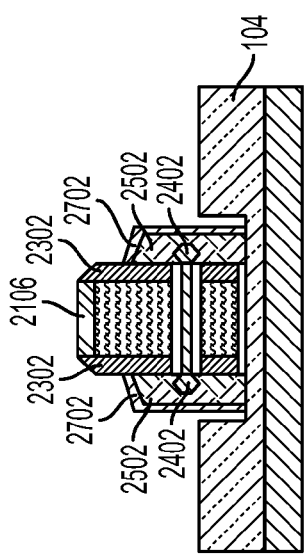
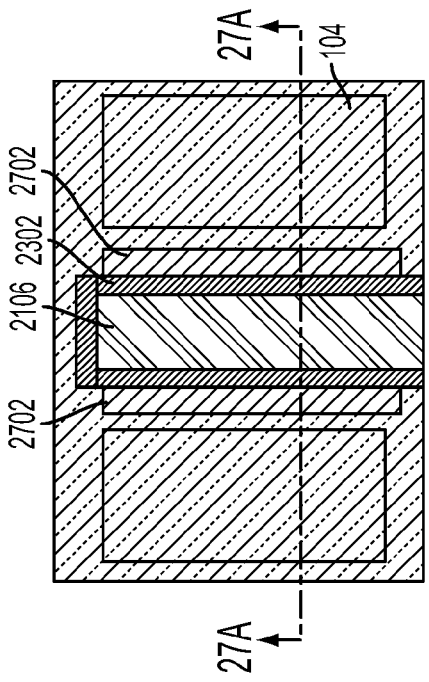
FIG. 27A
FIG. 27B
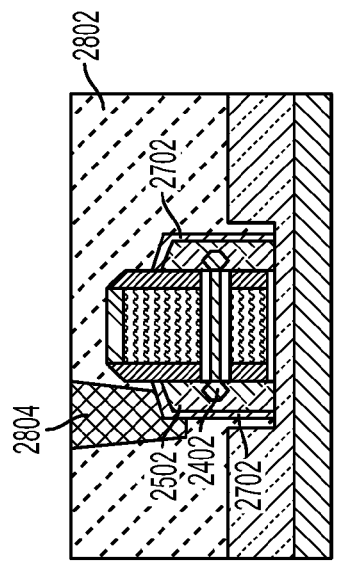
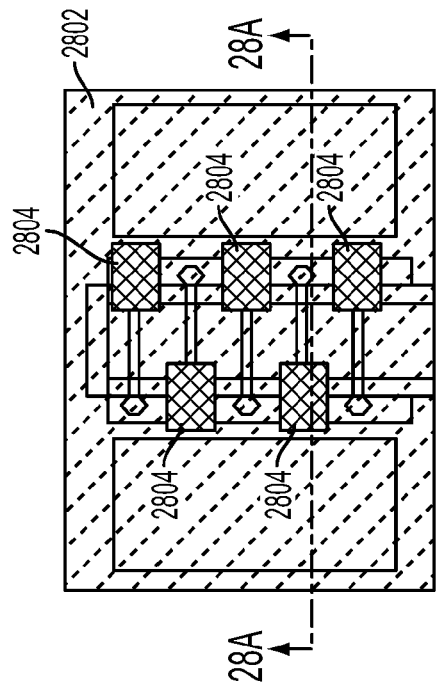
FIG. 28A
FIG. 28B

NANOWIRE FIELD EFFECT TRANSISTOR DEVICE

FIELD OF INVENTION

The present invention relates generally to nanowire field effect transistor devices, and more specifically, to active contact regions in nanowire field effect transistor devices.

DESCRIPTION OF RELATED ART

Nanowire field effect transistor (FET) devices often include a nanowire portion that defines a channel region. The channel region is surrounded by a gate stack portion that includes a dielectric layer and a conductive layer. Portions of the nanowire, or extended regions connected to the channel region are implanted or doped with donor or acceptor impurities to form active regions. The active regions are often covered with a silicide material and conductive contacts are formed that contact the silicide material.

BRIEF SUMMARY

According to one embodiment of the present invention, a method for forming a field effect transistor device includes forming a nanowire suspended above a substrate, forming a dummy gate stack on a portion of the substrate and around a portion of the nanowire, removing exposed portions of the nanowire, epitaxially growing nanowire extension portions from exposed portions of the nanowire, depositing a layer of semiconductor material over exposed portions of the substrate, the dummy gate stack and the nanowire extension portions, and removing portions of the semiconductor material to form sidewall contact regions arranged adjacent to the dummy gate stack and contacting the nanowire extension portions.

According to another embodiment of the present invention, method for forming a field effect transistor device includes forming a nanowire suspended above a substrate, forming a dummy gate stack on a portion of the substrate and around a portion of the nanowire, removing exposed portions of the nanowire, removing a portion of the dummy gate stack to further expose portions of the nanowire, depositing a layer of semiconductor material over exposed portions of the substrate, the dummy gate stack and the exposed portions of the nanowire, and removing portions of the semiconductor material to form sidewall contact regions arranged adjacent to the dummy gate stack and contacting the nanowire.

According to another embodiment of the present invention, a method for forming a field effect transistor device includes forming a nanowire suspended above a substrate, depositing a dielectric layer over the nanowire, depositing a conductive layer over the dielectric layer and exposed portions of the substrate, patterning a hard mask layer on a portion of the conductive layer, removing exposed portions of the conductive layer to form a gate stack, removing exposed portions of the dielectric layer to expose portions of the nanowire, removing exposed portions of the nanowire, epitaxially growing nanowire extension portions from exposed portions of the nanowire, depositing a layer of semiconductor material over exposed portions of the substrate, the gate stack, and the nanowire extension portions, and removing portions of the semiconductor material to form sidewall contact regions arranged adjacent to the gate stack and contacting the nanowire extension portions.

According to yet another embodiment of the present invention, a field effect transistor device includes a nanowire, a gate stack comprising, a gate dielectric layer disposed on the nanowire, a gate conductor layer disposed on the dielectric layer and a substrate, and an active region including a sidewall contact portion disposed on the substrate adjacent to the gate stack, the side wall contact portion is electrically in contact with the nanowire.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-17B illustrate an exemplary method for fabricating a FET device. In this regard:

FIG. 1A illustrates a cross-sectional view of nanowire.

FIG. 3A illustrates a cross-sectional view of deposition of a lithographically patternable dielectric layer.

FIG. 3B illustrates a top view of FIG. 3A.

FIG. 4A illustrates a cross-sectional view of patterning and development of the lithographically patternable dielectric layer.

FIG. 4B illustrates a top view of FIG. 4A.

FIG. 5A illustrates a cross-sectional view of removal exposed portions of the nanowires.

FIG. 5B illustrates a top view of FIG. 5A.

FIG. 6A illustrates a cross-sectional view of a selective epitaxial growth.

FIG. 6B illustrates a top view of FIG. 6A.

FIG. 9A illustrates a cross-sectional view of the removal of the residual regions of the amorphous layer.

FIG. 9B illustrates a top view of FIG. 9A.

FIG. 10A illustrates a cross-sectional view of the doping by ion implantation.

FIG. 10B illustrates a top view of FIG. 10A.

FIG. 11A illustrates a cross-sectional view of the formation of a silicide.

FIG. 11B illustrates a top view of FIG. 11A.

FIG. 12A illustrates a cross-sectional view of the deposition of a capping layer.

FIG. 12B illustrates a top view of FIG. 12A.

FIG. 15A illustrates a cross-sectional view of the formation of a gate dielectric layer and a gate conductor layer.

FIG. 15B illustrates a top view of FIG. 15A.

FIG. 16A illustrates a cross-sectional view of the formation of a gate capping layer.

FIG. 16B illustrates a top view of FIG. 16A.

FIG. 17B illustrates a top view of FIG. 17A.

FIGS. 18A-20B illustrate an alternate exemplary method for fabricating an alternative embodiment of a nanowire FET device. In this regard:

FIG. 18A illustrates a cross-sectional view of a dummy gate disposed on the insulator layer. The dummy gate encapsulate a nanowire.

FIG. 20B illustrates a top view of FIG. 20A.

FIGS. 21A-28B illustrate another alternate exemplary method for fabricating an alternative embodiment of a nanowire FET device. In this regard:

FIG. 21A illustrates a cross-sectional view of the formation of a gate conductor layer.

FIG. 21B illustrates a top view of FIG. 21A.

FIG. 22A illustrates a cross-sectional view of the gate line following the patterning of the gate conductor layer.

FIG. 22B illustrates a top view of FIG. 22A.

FIG. 23A illustrates a cross-sectional view of the formation of formation of spacers, and the removal of the nanowire portions outside the gated region.

FIG. 23B illustrates a top view of FIG. 23A.

FIG. 24A illustrates a cross-sectional view of the formation of nanowire extensions by epitaxy.

FIG. 24B illustrates a top view of FIG. 24A.

FIG. 27A illustrates a cross-sectional view of the formation of a silicide.

FIG. 27B illustrates a top view of FIG. 27A.

FIG. 28A illustrates a cross-sectional view of the formation of a capping layer and via to contact the nanowire extensions.

FIG. 28B illustrates a top view of FIG. 28A.

DETAILED DESCRIPTION

Nanowire field effect transistors (FETs) may be fabricated using a variety of methods. The nanowires in an array of FETs may have dissimilar dimensions either by design or due to process variations. The dissimilarities in the nanowires dimensions (e.g. nanowire diameter) may result in dissimilar source and drain regions sizes. As such the contact area that is available for contacting the device will also vary. The methods described below provide substantially uniform source and drain regions in an array of nanowire FETs, so contacts made to each device are independent of the nanowire size.

Figure 1A:
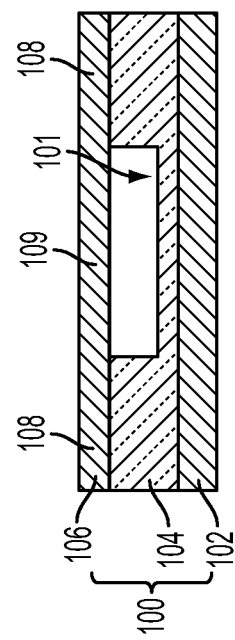
Figure 1B:
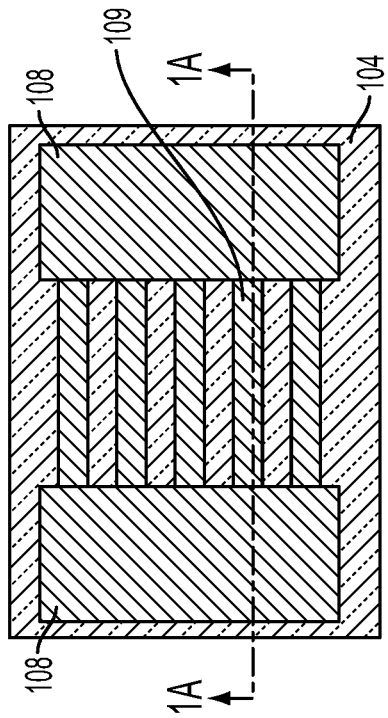
FIG. 1B illustrates a top view of FIG. 1A.

FIG. 1A illustrates a cross-sectional view of an exemplary method for forming nanowire FET devices along the line 1A of FIG. 1B. FIG. 1B illustrates a corresponding top view. In this regard, a substrate 100 includes a silicon layer 102 and an insulator layer 104 such as, for example, a buried oxide (BOX) layer. A silicon layer 106 disposed on the insulator layer 104 has been patterned by, for example, a lithographic patterning and etching process such as, for example, reactive ion etching (RIE) to form pad regions 108 and nanowire portions (nanowires) 109.

Figure 2A:
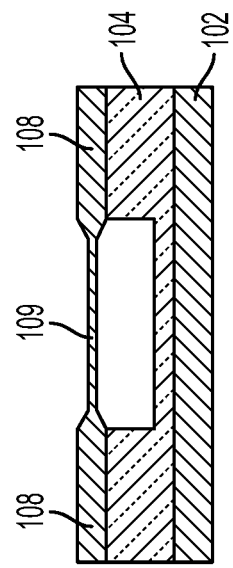
FIG. 2A illustrates a cross-sectional view of a nanowire following smoothing and thinning of the nanowire body.
Figure 2B:
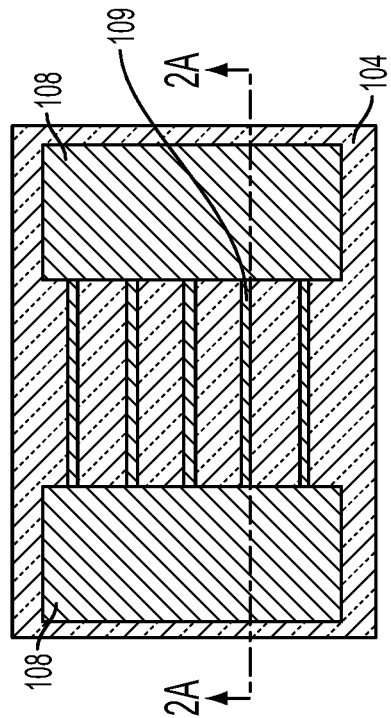
FIG. 2B illustrates a top view of FIG. 2A.

Once the regions 108 and nanowires 109 are patterned, an isotropic etching process suspends the nanowires 109 above the BOX layer 104 by removing a portion of the BOX layer 104 to form a recess region 101 that is below and adjacent to the nanowires 109. FIGS. 2A and 2B illustrate the resultant structure following the smoothing and thinning of the nanowire portions 109. The nanowires 109 may be smoothed to form elliptical shaped (and in some cases, cylindrical shaped) nanowires 109 that are suspended above the BOX layer 104 by the pad regions 108 using, for example, an annealing process. An oxidation process may be performed to reduce the diameter of the nanowires 109 to desired dimensions.

FIGS. 3A and 3B illustrate a cross-sectional and top view respectively of the deposition of a lithographically patternable dielectric layer 302. The lithographically patternable dielectric layer 302 may include any suitable material such as, for example, hydrogen silsesquioxane (HSQ). The lithographically patternable dielectric layer 302 is deposited over the insulator layer 104, the nanowires 109, and the pad regions 108 using, for example, a spin-on coating deposition process.

FIGS. 4A and 4B illustrate a cross-sectional and top view respectively of the resultant structure following the patterning and development of the lithographically patternable dielectric layer 302, which removes portions of the lithographically patternable dielectric layer 302 and forms a dummy gate 402 that is on over a portion of the insulator layer 104 and surrounds a portion of the nanowires 109. Following the formation of the dummy gate 402, an annealing process may be performed (e.g., an anneal in nitrogen at approximately 900° C.) to harden the dummy gate 402.

FIGS. 5A and 5B illustrate a cross-sectional and top view respectively of the resultant structure following a selective RIE or dry etching process that is performed to remove exposed portions of the nanowires 109 and the pad regions 108 (of FIGS. 4A and 4B). An example of a selective RIE process includes an RIE based on HBr chemistry that etches silicon while being selective to reduce the etching of dielectrics such as silicon oxide and silicon nitride. The portions of the nanowire 108 that are surrounded by the dummy gate 402 are not appreciably etched due to the directionality of the RIE process, and have exposed cross sections defined by the dummy gate 402.

FIGS. 6A and 6B illustrate a cross-sectional and top view respectively of the resultant structures following a selective epitaxial growth that may be performed to form nanowire extensions 602. The nanowire extensions 602 are epitaxially grown from the exposed cross-sectional portions of the nanowire 109 that are surrounded by the dummy gate 402. The nanowire extensions 602 are formed by epitaxially growing, for example, silicon (Si) or a silicon germanium (SiGe). The in the illustrated embodiment, the nanowire extensions 602 are grown with intrinsic or undoped materials. In an alternate embodiment, the nanowire extensions may be may be grown with in situ dopants that may be either n-type or p-type. The in-situ doped epi process forms the source region and the drain region of the nanowire FET. As an example, a chemical vapor deposition (CVD) reactor may be used to perform the epitaxial growth. Precursors for silicon epitaxy include $SiCl_4$, $SiH_4$ combined with HCl. The use of chlorine allows selective deposition of silicon only on exposed silicon surfaces. A precursor for SiGe may be a mixture of $SiH_4$ and $GeH_4$, which may obtain deposition selectivity without HCl. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

Figure 7A:
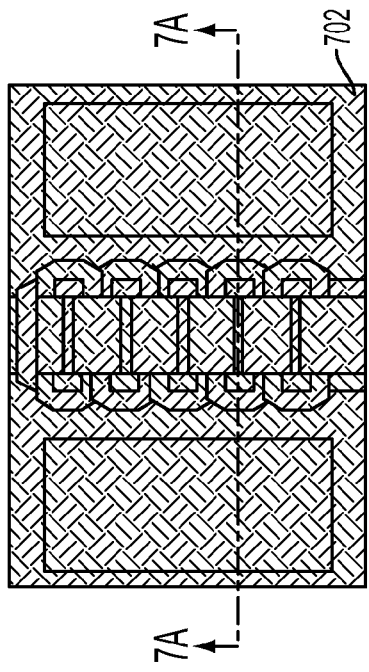
FIG. 7A illustrates a cross-sectional view of a deposition of an amorphous layer.
Figure 7B:
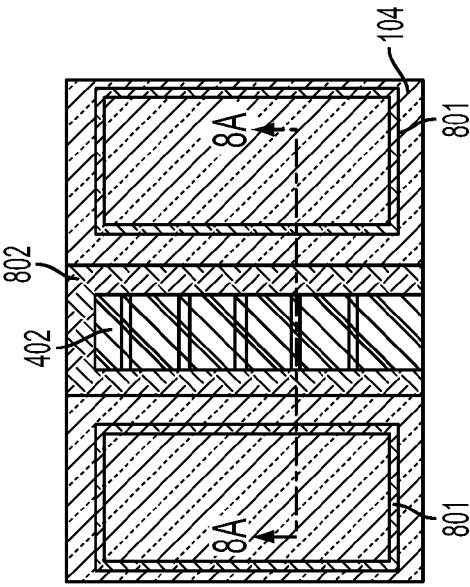
FIG. 7B illustrates top a view of FIG. 7A.

FIGS. 7A and 7B illustrate a cross-sectional and top view respectively of the deposition of an amorphous layer 702 that is deposited over the exposed portions of the insulator layer 104, the nanowire extensions 602, and the dummy gate 402. The amorphous layer 702 may include a silicon material or a germanium material. The amorphous layer 702 may include an undoped or intrinsic material, or in alternate embodiments, an in situ doped material. The amorphous layer 702 may be formed in the same chamber as the chamber used to epitaxially grow the nanowire extensions 602. In this regard, following the formation of the nanowire extensions 602, the chemistry in the chamber may be changed to result in the formation of the amorphous layer 702. The use of the same chamber to epitaxially grow the nanowire extensions 602 and the amorphous layer 702 prevents the formation of an interference (e.g., an oxide material) between the nanowire extensions 602 and the amorphous layer 702. The formation of the amorphous layer 702 may be performed by non-selective deposition of silicon, for example by flowing with $SiH_4$ without HCL.

Figure 8A:
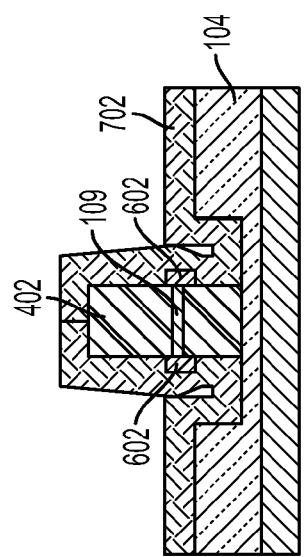
FIG. 8A illustrates a cross-sectional view of the removal of portions of the amorphous layer.
Figure 8B:
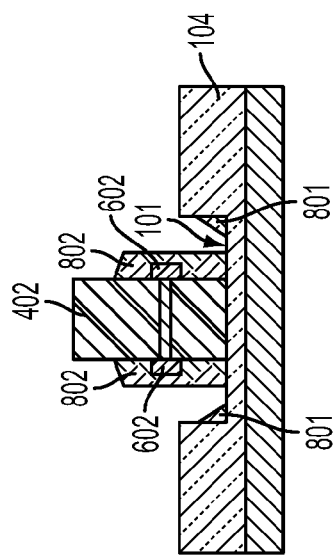
FIG. 8B illustrates a top view of FIG. 8A.

FIGS. 8A and 8B illustrate a cross-sectional and top view respectively of the resultant structure following the removal of portions of the amorphous layer 702 (of FIG. 7A) resulting in the formation of sidewall regions (sidewall contacts) 802. The sidewall regions 802 are disposed on the insulator layer 104 in the recess region 101, adjacent to the dummy gate 404. The sidewall regions 802 contact the nanowire extensions 602. The portions of the amorphous layer 702 may be removed with an etching process such as, for example, RIE. The etching process may result in residual regions 801 of amorphous layer 702 material.

Figure 8C:
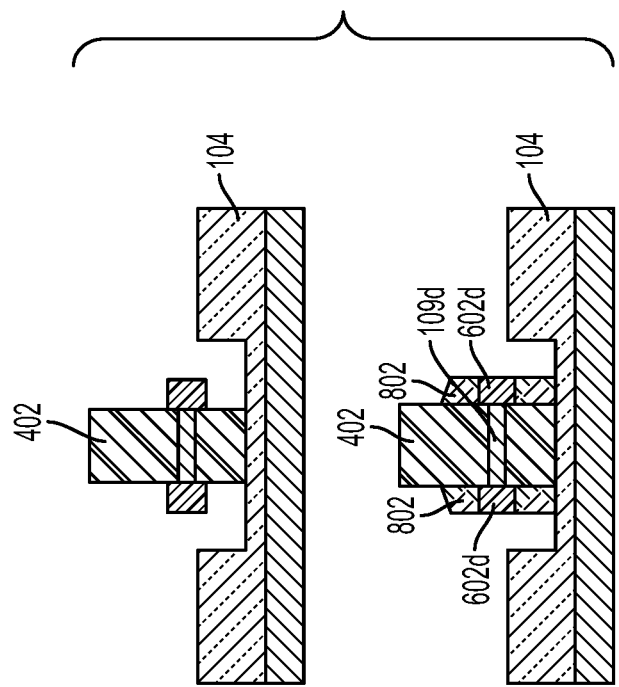
FIG. 8C illustrates a cross-sectional views of an example of a thin nanowire.
Figure 8D:
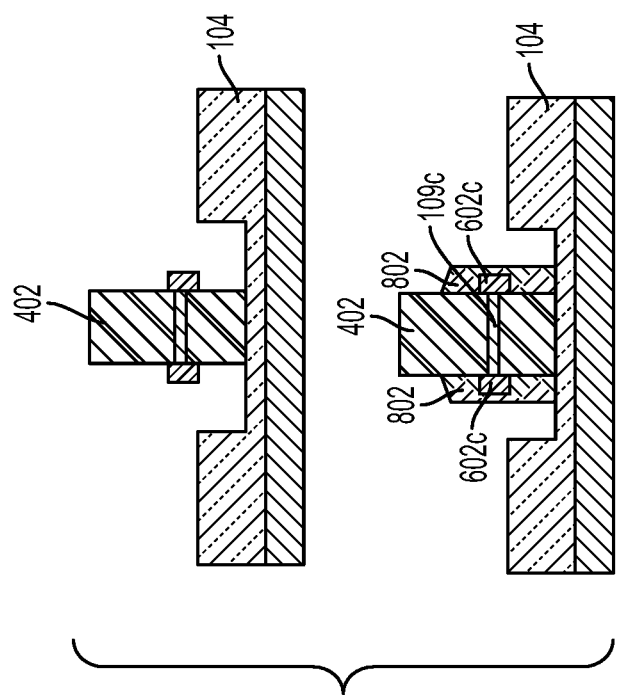
FIG. 8D illustrates a cross-sectional view of an example of a thick nanowire.

FIGS. 8C and 8D illustrate cross-sectional examples of nanowires 109c and 109d and nanowire extensions 602c and 602d, and the resultant sidewall regions 802. In this regard, FIG. 8C shows an arrangement similar to the FIGS. 6A and 8A with nanowires 109c having a first dimension and nanowire extensions 602c having a resultant dimension. FIG. 8D shows an arrangement similar to the FIGS. 6A and 8A with nanowires 109d having a second dimension (that is greater than the first dimension of the nanowires 109c of FIG. 8C) and nanowire extensions 602d having a resultant dimension that is greater than the dimension of the nanowire extensions 602c (of FIG. 8C). The dimension of the sidewall regions 802 is substantially similar in FIGS. 8C and 8D regardless of the dimensions of the nanowires 109c and 109d and the nanowire extensions 602c and 602d. Thus, substantially uniform sidewall regions 802 may be formed even if the dimensions of the nanowires 109 (and resultant nanowire extensions 602) vary in the device.

FIGS. 9A and 9B illustrate a cross-sectional and top view respectively of the resultant structure following the removal of the residual regions 801 (of FIG. 8A) of the amorphous layer 702 (of FIG. 7A). The residual regions 801 of the amorphous layer 702 may be removed, for example, by RIE using HBr chemistry. The removal of residue 801 is usually achieved by over etching when spacer 802 is formed.

FIGS. 10A and 10B illustrate a cross-sectional and top view respectively of the implantation of ions 1002 that may be performed to include dopants in the sidewall regions 802 and the nanowire extensions 602. The ion implantation may be performed, for example, in exemplary embodiments that may not have added dopants in situ during the epitaxial growth of the nanowire extensions 602 or the deposition of the amorphous layer 702 (of FIG. 7A). Thus, depending on the design specifications, the ion implantation may or may not be performed following the formation of the sidewall regions 802.

FIGS. 11A and 11B illustrate a cross-sectional and top view respectively following the formation of a silicide 1102 that may be formed on the sidewall regions 802 and, in some embodiments, exposed portions of the nanowire extensions 602. Examples of silicide forming metals include Ni, Pt, Co, and alloys such as NiPt. When Ni is used the NiSi phase is formed due to its low resistivity. For example, for silicide formation rapid thermal annealing (RTA) in the temperature range of 350-700° C. may be used. A more specific example, when NiSi is formed RTA conditions are about 420° C. for about 5 seconds in $N_2$ ambient. Residual un-reacted metals may be removed from the insulator layer 104 and the dummy gate 402 with a suitable etching process. For example, when NiSi is used, the unreacted Ni can be etched selectively using an aqua regia solution (mixture of nitric and hydrochloric acids).

FIGS. 12A and 12B illustrate a cross-sectional and top view respectively following the deposition of a capping layer 1202 that may include, for example, an oxide material or a low-K dielectric (LKD) material. Capping layer 1202 is formed over exposed portions of the insulator layer 104, the dummy gate 402 and the silicide 1102 (or exposed sidewall regions 802 and nanowire extensions 602).

Figure 13A:
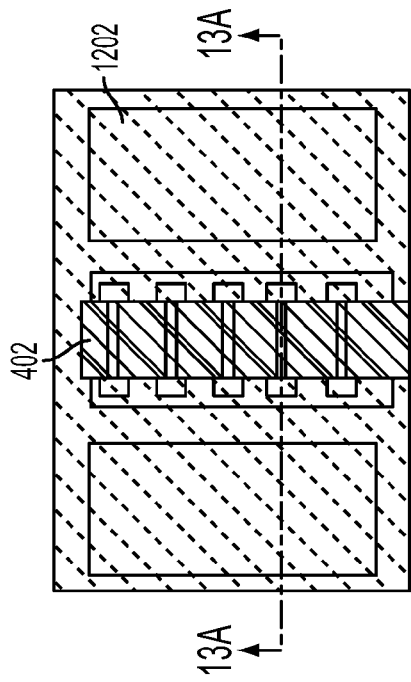
FIG. 13A illustrates a cross-sectional view of the planarization of the capping layer.
Figure 13B:
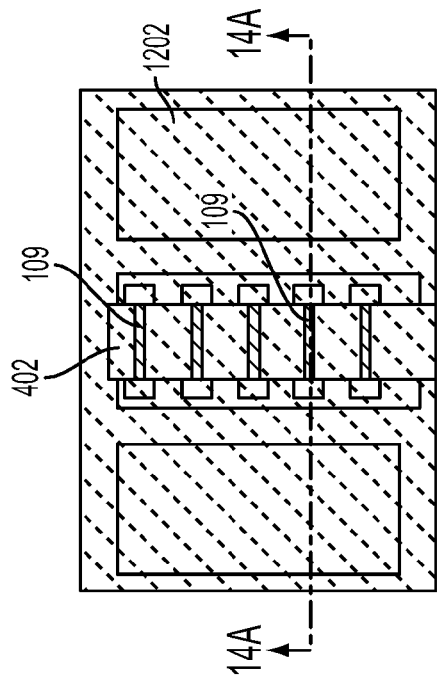
FIG. 13B illustrates a top view of FIG. 13A.

FIGS. 13A and 13B illustrate a cross-sectional and top view respectively following the planarization of the capping layer 1202 that removes portions of the capping layer 1202 and, in some embodiments, portions of the dummy gate 402 to expose the dummy gate 402. The planarization may be performed using, for example, a chemical mechanical polishing (CMP) process.

Figure 14A:
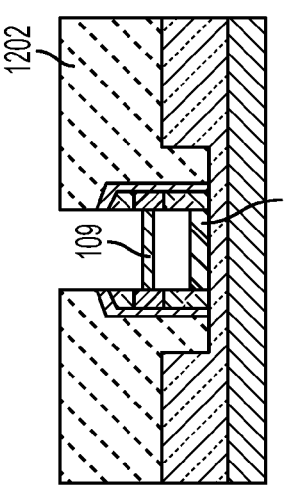
FIG. 14A illustrates a cross-sectional view of the removal of portions of the dummy gate.
Figure 14B:
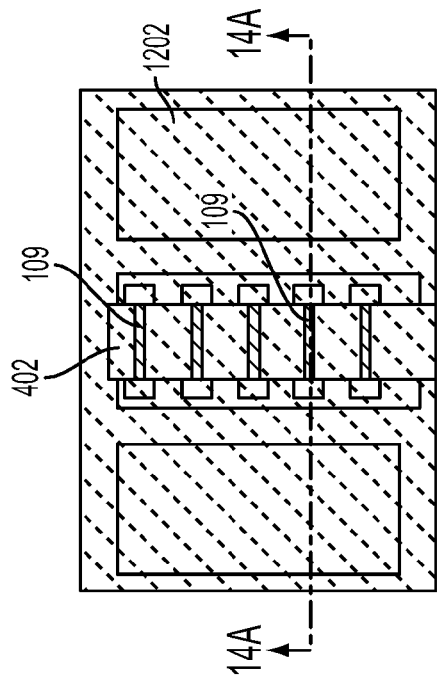
FIG. 14B illustrates a top view of FIG. 14A.

FIGS. 14A and 14B illustrate a cross-sectional and top view respectively following the removal of portions, or in some embodiments, all of the dummy gate 402 to expose the nanowire 109. The dummy gate 402 material may be removed using, for example, a chemical etching process that is selective to silicon and the capping layer 1202 material. For example, when the dummy gate 402 includes of HSQ, and the capping layer 1202 material includes of LKD-1037, diluted hydrofluoric acid can be used to etch out selectively the dummy gate 402.

FIGS. 15A and 15B illustrate a cross-sectional and top view respectively following the formation of a gate dielectric layer 1502 and a gate conductor layer 1504 around the exposed nanowire 109. The gate dielectric layer 1502 may include a single layer of dielectric material or more than one layer of dielectric materials such as, for example, silicon dioxide ($SiO_2$) around the nanowire 109, and hafnium oxide ($HfO_2$) formed around $SiO_2$. Following the formation of the gate dielectric layer 1502, a gate conductor layer 1504 is formed around the gate dielectric layer 1502 (i.e., around the nanowire 109). For example, the gate conductor may include titanium nitride (TiN), tantalum nitride (TaN), aluminum (Al), and tungsten (W). Film stacks such as TiN/Al or TaN/doped poly-Si are also typical. In this regard, the gate conductor layer 1504 may be formed over the exposed portions of the dielectric layer 1502 and the capping layer 1202. A planarization process may be performed such as, for example, CMP to remove residual gate conductor 1504 material from the capping layer 1202 to expose the capping layer 1202.

FIGS. 16A and 16B illustrate a cross-sectional and top view respectively following the formation of a gate capping layer 1602 over the exposed portions of the gate conductor layer 1504. The gate capping layer 1602 may include, for example, a dielectric material that is deposited over the gate conductor layer 1504 and portions of the capping layer 1202. A planarization process may be performed such as, for example, CMP to remove residual gate capping layer 1602 material from the capping layer 1202 to expose the capping layer 1202.

Figure 17A:
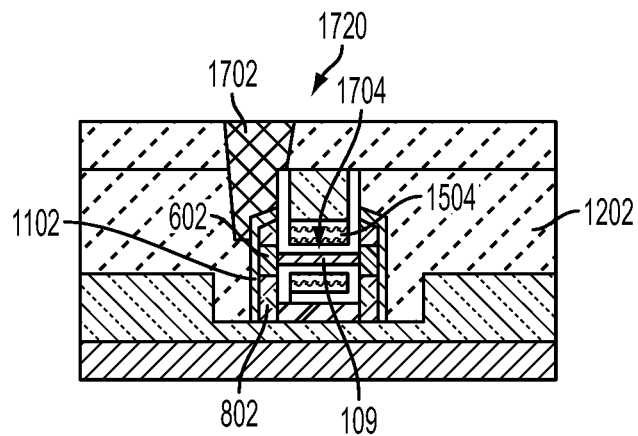
FIG. 17A illustrates a cross-sectional view of the formation of conductive vias.
Figure 17B:
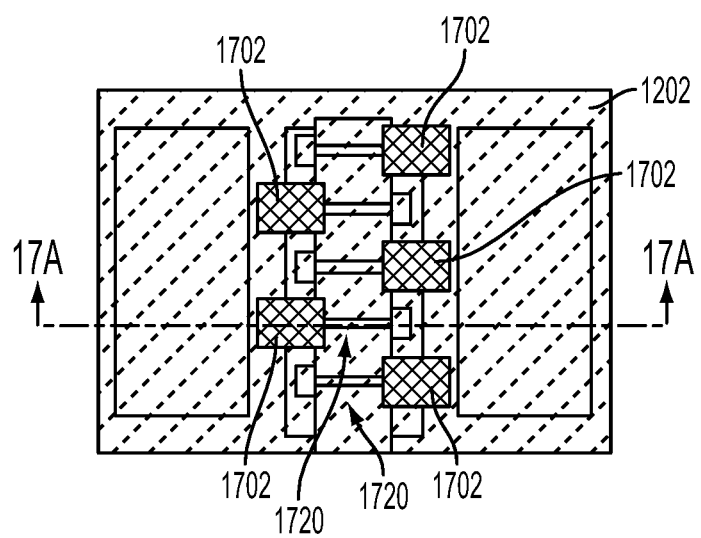

FIGS. 17A and 17B illustrate a cross-sectional and top view respectively following the formation of conductive vias 1702 that contact the silicide 1102 (or the active regions defined by the sidewall regions 802, the nanowire extensions 602, and the silicide 1102), and a resultant exemplary embodiment of nanowire FET devices 1720. The nanowire 109 defines the channel region 1704 of the device. The conductive vias 1702 may be formed by as explained below. A lithographic patterning and etching process may be used to form cavities that expose portions of the silicide 1102. A deposition of conductive material such as, for example tungsten, or copper is performed to fill the cavities. Residual conducive material may be removed from the capping layer 1202 using a planarization process such as, for example, CMP. In the illustrated embodiment, the conductive vias 1702 are arranged in a pattern that reduces the occurrences of shorts between the contacts to the source and contacts to the drain made by vias 1702. Alternate embodiments may include any suitable arrangement of conductive vias 1702.

Figure 18A:
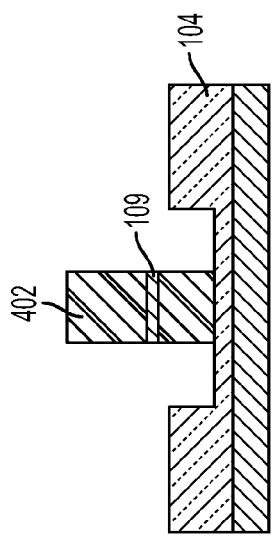
Figure 18B:
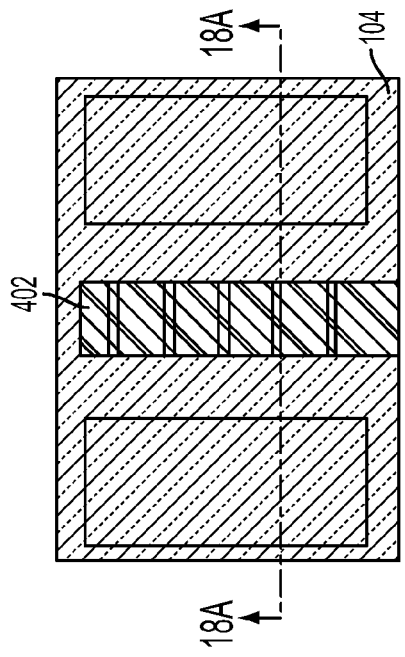
FIG. 18B illustrates a top view of FIG. 18A.

FIGS. 18A-20B illustrate an alternate exemplary method for fabricating an alternative embodiment of a nanowire FET device. FIGS. 18A and 18B illustrate a cross-sectional and top view respectively of a structure similar to the structure described above in FIGS. 5A and 5B. The methods described above in FIGS. 1A-5B have been performed to result in the illustrated structure shown in FIGS. 18A and 18B that includes the dummy gate 402 disposed on the insulator layer 104. The dummy gate 402 surrounds the nanowire 109, and cross-sectional portions of the nanowire 109 are exposed.

Figure 19A:
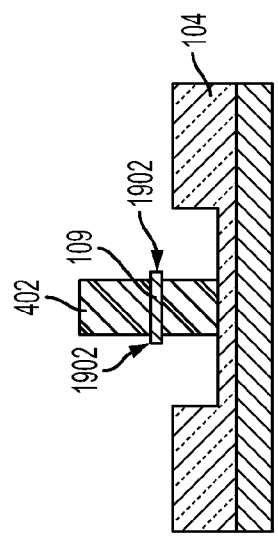
FIG. 19A illustrates a cross-sectional view of the removal of portions of the dummy gate to expose the ends of the nanowire.
Figure 19B:
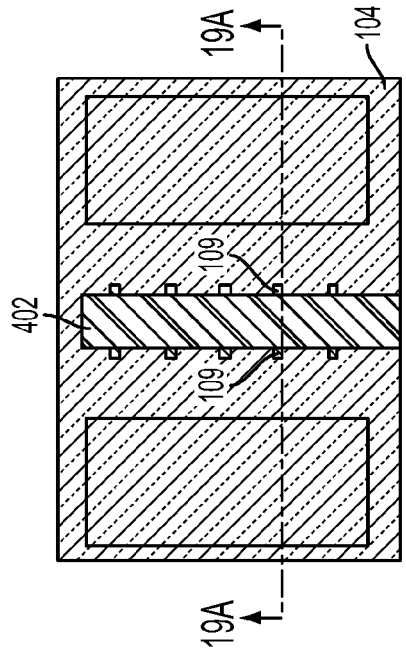
FIG. 19B illustrates a top view of FIG. 19A.

FIGS. 19A and 19B illustrate a cross-sectional and top view respectively of the resultant structure following the removal of portions of the dummy gate 402 to further expose portions of the nanowire 109. In this regard, a chemical dip process, such as, for example, a diluted HF dip is performed to remove exposed portions of the dummy gate 402. In alternate embodiments another suitable process may be used to remove portions of the dummy gate 402 and further expose portions of the nanowire 109. Removal of portions of the dummy gate 402 exposes distal ends 1902 of the nanowires 109.

Figure 20A:
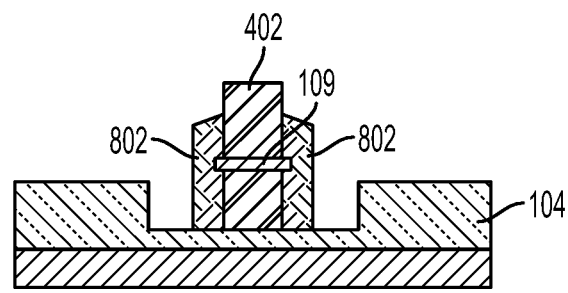
FIG. 20A illustrates a cross-sectional view of the formation of sidewall regions.
Figure 20B:
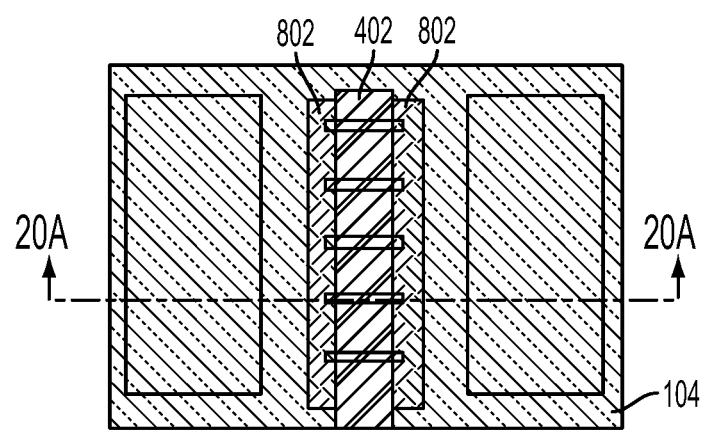

FIGS. 20A and 20B illustrate a cross-sectional and top view respectively of the resultant structure following the formation of sidewall regions 802 in a similar manner as described above in FIGS. 7A-8B. In this regard, an amorphous layer of, for example, a silicon or germanium material is formed over the exposed portions of the nanowires 109, the dummy gate 402, and the insulator layer 104. Portions of the amorphous layer may be removed using, for example, RIE to form the sidewall regions 802. Following the formation of the sidewall regions 802 in FIGS. 20A and 20B, subsequent fabrication methods similar to the methods shown in FIGS. 10A-17B may be performed to form an alternate exemplary embodiment of a nanowire FET device.

FIGS. 21A-28B illustrate an alternate exemplary method for fabricating an alternative embodiment of a nanowire FET device. FIGS. 21A and 21B illustrate a cross-sectional and top view respectively of a structure similar to the structure described above in FIGS. 2A and 2B following the deposition of a gate dielectric layer 2102 over exposed portions of the insulator layer 104, the nanowire 109, and the pad regions 108. The gate dielectric layer 2102 may include a single layer of dielectric material or more than one layer of dielectric materials such as, for example, silicon dioxide ($SiO_2$) around the nanowire 109, and hafnium oxide ($HfO_2$) formed around $SiO_2$. Following the formation of the gate dielectric layer 2102, a gate conductor layer 2104 is formed around the gate dielectric layer 2102 (i.e., around the nanowire 109) and over portions of the pad regions 108 and the insulator layer 104. In this regard, the gate conductor layer 2104 may be formed over the exposed portions of the dielectric layer 2102. A planarization process may be performed such as, for example, CMP on the gate conductor layer 2014. Following the formation of the gate conductor layer 2104, a hardmask layer 2106 is deposited and patterned using, for example, photolithography followed by an etching process such as RIE.

FIGS. 22A and 22B illustrate a cross-sectional and top view respectively of the resultant structure following the removal of exposed portions of the gate conductor layer 2104 using an etching process such as, for example, RIE. The resultant structure includes a gate stack portion 2202 defining a channel region 2204 of the nanowire 109. The etching process should be selective to the gate dielectric 2102 so the nanowire 109 is not cut off from the pads 108.

FIGS. 23A and 23B illustrate a cross-sectional and top view respectively of the resultant structure following the formation of spacers 2302 and the removal of exposed portions of the gate dielectric layer 2102, exposed portion of the nanowire 109, and the pad regions 108 (of FIG. 22A). The spacers 2302 may include a nitride or oxide material. As part of the spacers formation or following the formation of the spacers 2302, an etching process such as, for example, a dry etch, or RIE process may be performed to remove the exposed portions of the gate dielectric layer 2102, exposed portion of the nanowire 109, and the pad regions 108, and expose portions of the insulator layer 104.

FIGS. 24A and 24B illustrate a cross-sectional and top view respectively of the resultant structure following the formation of nanowire extensions 2402. The nanowire extensions 2402 are epitaxially grown from the exposed cross-sectional portions of the nanowire 109 defined by the spacers 2302, and may be formed in a similar manner as described above regarding the formation of the nanowire extensions 602 (of FIG. 6A). The selective epitaxy process used in this embodiment should be selective to the spacers 2302 material, which may be chemically different than the dummy gate material 402 (of FIG. 6A)

Figure 25B:
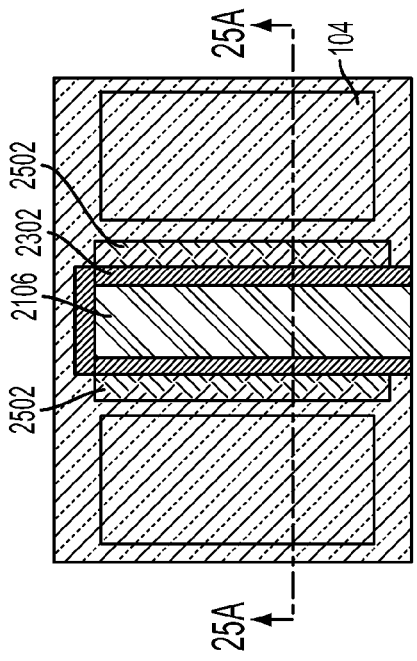
FIG. 25B illustrates a top view of FIG. 25A.
Figure 25A:
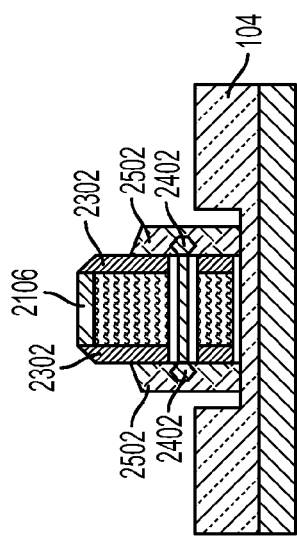
FIG. 25A illustrates a cross-sectional view of the formation of a formation of sidewall regions.

FIGS. 25A and 25B illustrate a cross-sectional and top view respectively of the resultant structure following the formation of sidewall regions 2502 in a similar manner as described above in FIGS. 7A-8B. In this regard, an amorphous layer of, for example, a silicon or germanium material is formed over the exposed portions of the nanowire extensions 2402, the spacers 2302, the hardmask layer 2016, and the insulator layer 104. Portions of the amorphous layer may be removed using, for example, RIE to form the sidewall regions 2502.

Figure 26B:
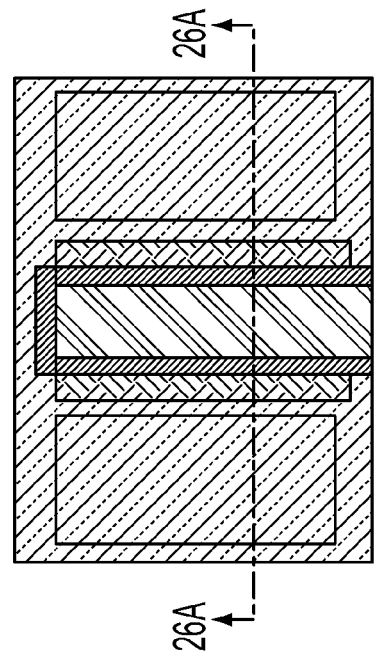
FIG. 26B illustrates a top view of FIG. 26A.
Figure 26A:
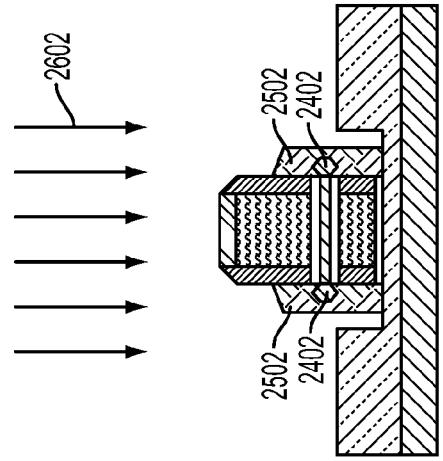
FIG. 26A illustrates a cross-sectional view of doping by ion implantation.

FIGS. 26A and 26B illustrate a cross-sectional and top view respectively of the implantation of impurities 2602 that may be performed to dope the sidewall regions 2502 and the nanowire extensions 2402. The ion implantation may be performed, for example, in exemplary embodiments that may not have added dopants in situ during the epitaxial growth of the nanowire extensions 2402 or the deposition of the amorphous layer. Thus, depending on the design specifications, the ion implantation may or may not be performed following the formation of the sidewall regions 2502.

FIGS. 27A and 27B illustrate a cross-sectional and top view respectively following the formation of a silicide 2702 that may be formed on the sidewall regions 2502 and, in some embodiments, exposed portions of the nanowire extensions 2402 in a similar manner as described above in FIG. 11A.

FIGS. 28A and 28B illustrate a cross-sectional and top view respectively following the formation of a capping layer 2802 and conductive vias 2804. The capping layer 2802 may be formed from, for example, an oxide material, and the conductive vias 2804 are formed using a similar method as described above in FIG. 17A.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a field effect transistor device, the method comprising:
   forming a nanowire suspended above a substrate;
   forming a dummy gate stack on a portion of the substrate and around a portion of the nanowire;
   removing exposed portions of the nanowire;
   epitaxially growing nanowire extension portions from exposed portions of the nanowire;
   depositing a layer of semiconductor material over exposed portions of the substrate, the dummy gate stack and the nanowire extension portions;
   removing portions of the semiconductor material to form sidewall contact regions arranged adjacent to the dummy gate stack and contacting the nanowire extension portions;
   forming a silicide on exposed portions of the sidewall contact regions;
   depositing a capping layer over the silicide, and exposed portions of the dummy gate stack and the substrate;
   removing portions of the capping layer to expose a portion of the dummy gate;
   removing a portion of the dummy gate to expose the nanowire;
   depositing a dielectric layer over exposed portions of the nanowire;
   depositing conductive layer over the dielectric layer; and
   forming a capping layer over exposed portions of the conductive layer.

2. The method of claim 1, wherein the layer of semiconductor material includes an amorphous semiconductor material.

3. The method of claim 1, wherein the removing portions of the semiconductor material is performed by a reactive ion etching process.

4. The method of claim 1, wherein the nanowires include a semiconductor material.

5. The method of claim 1, wherein the dummy gate is formed by:
   depositing a lithographically patternable dielectric layer over exposed portions of the substrate, and the nanowire;
   patterning the lithographically patternable dielectric layer to define the dummy gate region by an electron beam exposure followed by developing.

6. The method of claim 1, further comprising implanting dopants into the nanowire extension portions and the sidewall contact regions.

* * * * *